United States Patent
Fallah

(10) Patent No.: US 6,871,310 B2
(45) Date of Patent: Mar. 22, 2005

(54) BINARY TIME-FRAME EXPANSION OF SEQUENTIAL SYSTEMS

(75) Inventor: Farzan Fallah, San Jose, CA (US)

(73) Assignee: Fujitsu Limited, Kawasaki (JP)

(*) Notice: Subject to any disclaimer, the term of this patent is extended or adjusted under 35 U.S.C. 154(b) by 474 days.

(21) Appl. No.: 10/162,018

(22) Filed: Jun. 3, 2002

(65) Prior Publication Data

US 2003/0226075 A1 Dec. 4, 2003

(51) Int. Cl.⁷ .......................... G01R 31/28; G06F 9/45
(52) U.S. Cl. ........................................ 714/724; 716/6
(58) Field of Search ................... 714/724, 726, 714/727, 728, 729, 811, 815, 55; 716/1, 4, 5, 6; 713/500, 503

(56) References Cited

U.S. PATENT DOCUMENTS

| | | | |
|---|---|---|---|
| 3,985,967 A | 10/1976 | Colton et al. | 179/15 |
| 4,745,603 A * | 5/1988 | Shedd | 714/739 |
| 5,377,197 A | 12/1994 | Patel et al. | 371/23 |
| 5,448,497 A * | 9/1995 | Ashar et al. | 716/6 |
| 5,566,187 A | 10/1996 | Abramovici et al. | 371/22 |
| 5,590,135 A | 12/1996 | Abramovici et al. | 371/22 |
| 5,668,481 A | 9/1997 | Sheu et al. | 326/16 |
| 5,875,196 A | 2/1999 | Chakradhar et al. | 371/22.1 |
| 6,292,915 B1 | 9/2001 | Hosokawa et al. | 714/726 |
| 6,581,197 B1 * | 6/2003 | Foutz et al. | 716/6 |
| 2002/0147951 A1 * | 10/2002 | Nadeau-Dostie et al. | 714/731 |

OTHER PUBLICATIONS

D. G. Saab, et al., *Iterative [Simulation–Based Genetics + Deterministic Techniques] = Complete ATPG*, © 1994 ACM 0–89791–690–5/94/0011/0040 (pp. 40–43), 1994.

D. Stoffel, et al., *Record & Play: A Structural Fixed Point Iteration for Sequential Circuit Verification*, Institute of Computer Science III, University of Potsdam, © 1997 IEEE, 1997.

U. Gläser, et al., *Logic Optimization by an Improved Seqential Redundancy Addition and Removal Technique*, The German National Research Center for Computer Science (GMD), Department of Electrical and Computer Engineering, Univ. of California.

J. R. Burch, et al., *Symbolic Model Checking for Sequential Circuit Verification*, School of Computer Science, Carnegie Mellon University, PA., IEEE. Jul. 15, 1993.

T. Larrabee, *Test Pattern Generation Using Boolean Satisfiability*, Computer Engineering Board of Studies, Univ. of CA.

* cited by examiner

Primary Examiner—Christine T. Tu
(74) Attorney, Agent, or Firm—Baker Botts L.L.P.

(57) ABSTRACT

A processing system provides for analysis of sequential systems using binary time-frame expansion of these systems. This expansion technique produces models in which inputs and values for time may be treated as variables for producing various outputs and states.

20 Claims, 2 Drawing Sheets

US 6,871,310 B2

BINARY TIME-FRAME EXPANSION OF SEQUENTIAL SYSTEMS

TECHNICAL FIELD OF THE INVENTION

The present invention relates generally to system modeling and analysis and, more particularly, time-frame expansion of sequential systems.

BACKGROUND OF THE INVENTION

Systems and circuits generally fall into one of two categories, either combinational or sequential. Combinational circuits generate outputs purely as a function of inputs. Sequential circuits generate outputs as a function of inputs and a current state, with the state changing over time. For combinational circuits, algorithms can quickly test and validate the logic. However for sequential circuits, the variance in output as a function of input over time can hinder testing and verification.

SUMMARY OF THE INVENTION

In accordance with the present invention, techniques for binary time-frame expansion of sequential systems are provided. According to particular embodiments, these techniques permit the analysis of sequential systems over time in a binary fashion.

According to a particular embodiment, a method for processing a sequential system determines a maximum time-frame for analysis of a sequential circuit, the maximum time-frame representable using an n-bit binary value, and generates a binary time-frame expanded model of the sequential circuit, the binary time-frame expanded model having n cascaded binary time-frame clauses. The method further analyzes the sequential circuit using the binary time-frame expanded model and generates an analysis report.

Embodiments of the invention provide various technical advantages. These techniques speed analysis of sequential systems and enable binary searches across a number of time-frames during analysis of sequential systems. This can reduce computation time during logic analysis and can increase the likelihood of finding a solution, within an allocated amount of CPU time, given specified outputs of a sequential system.

Other technical advantages of the present invention will be readily apparent to one skilled in the art from the following figures, descriptions, and claims. Moreover, while specific advantages have been enumerated above, various embodiments may include all, some, or none of the enumerated advantages.

BRIEF DESCRIPTION OF THE DRAWINGS

For a more complete understanding of the present invention and its advantages, reference is now made to the following description, taken in conjunction with the accompanying drawings, in which.

DETAILED DESCRIPTION OF THE DRAWINGS

Figure 1:
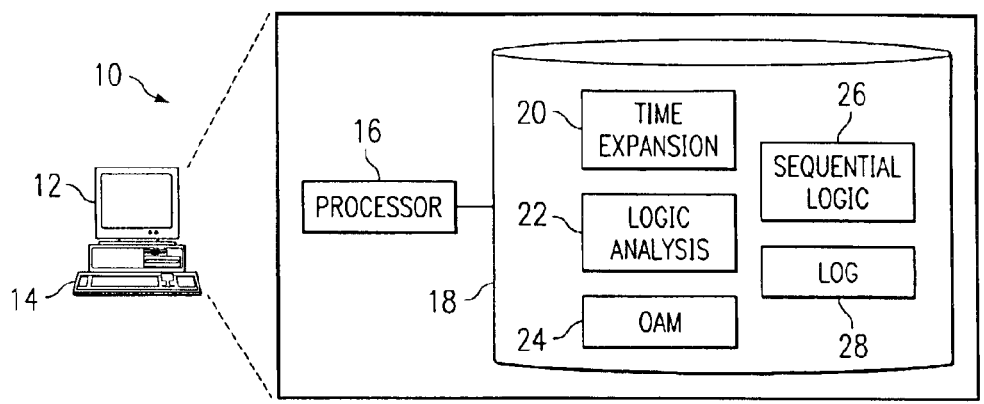
FIG. 1 illustrates a processing system for performing binary time-frame expansion of sequential systems in accordance with various embodiments of the present invention.

FIG. 1 illustrates a processing system, indicated at 10, that includes a display 12, an input 14, a processor 16, and a memory 18. In the embodiment illustrated, memory 18 maintains a binary time expansion processing module 20, a systems analysis module 22, operations administration and management (OAM) module 24, sequential system designs 26, and a log 28. In general, system 10 supports binary time-frame expansion to facilitate analysis of sequential circuits.

System 10 represents any suitable combination and arrangement of elements that implement binary time-frame expansion of sequential systems and exploit the resulting models for analysis. Thus while pictured as a desktop computer, system 10 may include any appropriate hardware and/or logic as appropriate to implement its features and functionality. For interfacing with users, system 10 includes display 12 and input 14. Display 12 supports the presentation of information to users, while input 14 supports the receipt of information from users. For example, display 12 may represent a computer monitor, and input 14 a keyboard and mouse.

Processor 16 represents any suitable hardware, firmware, and/or other elements providing computing and processing capabilities. For example, processor 16 may include one or more special purpose and/or general purpose microprocessors. In the embodiment illustrated, processor 16 provides features and functionality by accessing information maintained within memory 18.

Memory 18 represents any suitable local or distributed memory storage devices. In the embodiment illustrated, memory 18 maintains binary time-frame expansion module 20, systems analysis module 22, OAM module 24, sequential system designs 26, and log 28. Expansion module 20, systems analysis module 22, and OAM module 24 each represent software or other appropriate controlling logic for execution by one or more elements of system 10. Expansion module 20 operates to perform binary time-frame expansion of sequential systems. Systems analysis module 22 operates to analyze circuit and/or system models. For example, systems analysis module 22 may perform analysis on a time-frame expanded logic circuit generated by expansion module 20 to test and validate the circuit. OAM module 24 supports the operation, administration, and management of elements within system 10. For example, OAM module 24 may include code for execution by processor 16 that controls interfacing with users through display 12 and input 14 and, at appropriate times, executes expansion module 20 and systems analysis module 22.

Sequential system designs 26 includes data that models any number of sequential logic systems and circuits. As used in this discussion, the terms sequential system, sequential logic, sequential logic circuit, and sequential circuit all refer to any appropriate system, circuit or logic design, or a model of these, that provides for generation of output based upon inputs and state information. For example, a sequential system may be a semiconductor design that includes any number of combinational logic devices and one or more registers, latches, or other memory elements that introduce state information into the computation of outputs. Sequential system designs 26 includes information that enables modeling of the elements forming sequential systems. Using a particular one of sequential system designs 26, system 10 can determine the behavior of a circuit given values for states within the circuit and values for inputs to the circuit.

Log 28 includes information detailing the performance and results of the operation of system 10. For example, log 28 may include performance statistics detailing the operation of systems analysis module 22 during analysis of binary time-frame expanded sequential systems. Log 28 may further include the results of this analysis, such as inputs identified for testing and verifying circuits. However, while the particular embodiment details particular information maintained in memory 18, system 10 contemplates implementing the features and functionality using any suitable data maintained in any appropriate form.

Figure 2:
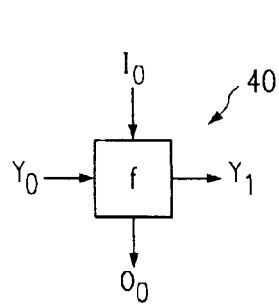
FIG. 2 is a block diagram illustrating operation of a sequential system during a single time-frame.

FIG. 2 is a block diagram illustrating the operation of a sequential circuit during one time-frame. In this illustration, the sequential circuit performs a function $f$ given an input, $I_0$, and a current state, $Y_0$, to generate an output, $O_0$. As a result of this operation, the state of the sequential circuit changes to a new state, $Y_1$. Thus, during the next time-frame this sequential circuit will perform $f$ based on input received during that time-frame and given the state $Y_1$. However, while illustrated as inputs and outputs of the sequential circuit, the state information ($Y_0$ and $Y_1$) may be maintained internally using registers, latches, or other appropriate elements within the circuit. Thus the block diagram provides merely an illustrative representation of the operation for one time-frame of the sequential circuit.

The operation of a sequential system at any particular time-frame can be written as $f^t$ (Equation 1), with the value for t indicating the particular time-frame. For example, $f^1$ denotes the operation of the sequential circuit in the first time-frame, since t equal to one indicates the sequential circuit in one clock cycle. If t is considered as an n-bit number represented by $[t_{n-1} \ldots t_i \ldots t_0]$, then t can be written as $$t = \sum_{i=0,\ldots,n-1} t_i \times 2^i. \quad \text{(Equation 2)}$$

Thus by combining Equation 1 and Equation 2, $f^t$ can be written as $$f^t = f^{\sum_{0 \le i < n} t_i \times 2^i} = f^{t_{n-1} \times 2^{n-1}} \times f^{t_{n-2} \times 2^{n-2}} \times \ldots \times f^{t_0 \times 2^0}, \quad \text{(Equation 3)}$$

where the cross operator is defined as $f^{m+n} = f^m \times f^n$. Because $t_i$ represents a binary digit, the value for $t_i$ may be either 1 or 0, and the value for each clause in Equation 3 can be written as $$f^{t_i \times 2^i} = \begin{cases} f^{2^i} & \text{if } t_i = 1 \\ 1 & \text{if } t_i = 0 \end{cases}. \quad \text{(Equation 4)}$$

Figure 3:
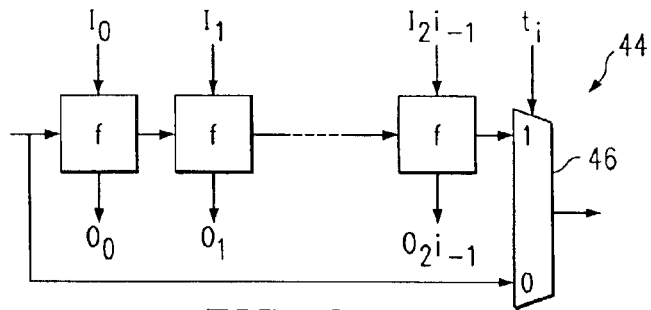
FIG. 3 is a block diagram illustrating a generic, binary time-frame expanded clause generated by the processing system during binary time-frame expansion.

FIG. 3 is a block diagram depicting a circuit model of Equation 4, which includes a multiplexer selecting, based on a value of $t_i$, between an initial state and the state resulting from a series of $2^i$ copies of a sequential circuit. This binary time-frame expanded clause, indicated at 44, models the operation of the sequential circuit during a particular time-frame using the inputs and the value for $t_i$ as variables. Within clause 44, each copy of the sequential circuit generates outputs based upon received inputs and state information.

The first copy of the sequential circuit operates using state information received by clause 44 and inputs received in the first time-frame to generate outputs for the first time-frame. In addition, the first copy of the sequential circuit provides state information resulting from its processing to the second copy of the sequential circuit. The second copy of the sequential circuit operates using the state information received from the first copy and input for the second time-frame of operation to generate output reflecting output during the second time-frame of operation. The series of copies of the sequential circuit each operate in similar fashion up to the last copy, which provides state information to a multiplexer 46.

Based upon the value for $t_i$, multiplexer 46 selects between the state information generated by the last copy of the sequential circuit and the state information received by clause 44. In operation, clause 44 passes through state information if $t_i$ is equal to zero, or clause 44 provides state information generated by the series of copies of the sequential circuit if $t_i$ is equal to one. By cascading multiple clauses for each bit within t, system 10 may generate a full, binary time-frame expanded model of the sequential circuit. Therefore, given this model for Equation 4, Equation 3 may be modeled as a series of time-frame clauses for each binary digit used in t.

Figure 4:
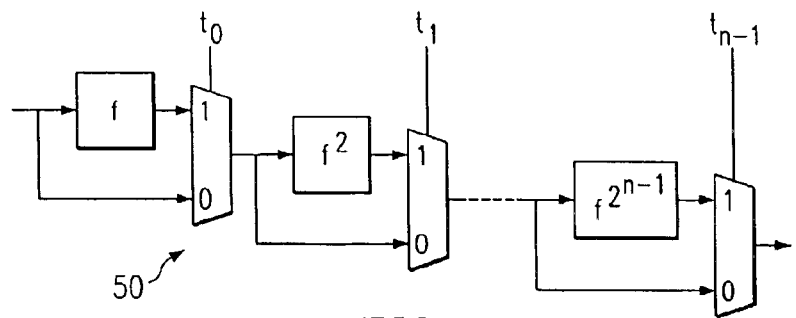
FIG. 4 is a block diagram illustrating a series of generic clauses linked together to allow analysis of a sequential system over time.

FIG. 4 is a block diagram illustrating a model 50 of Equation 3 for all time-frames where the time-frame, t, may be represented as an n-bit number. For example, given an eight bit t, model 50 would include eight time-frame clauses and operate to model the operation of the sequential circuit for up to 255 time-frames. In this figure, the first two time-frame clauses and the last time-frame clause for the equation are illustrated. The cascaded series of time-frame clauses permits the modeling of the behavior of the sequential circuit for all time-frames less than or equal to the maximum value representable by an n-bit t. This enables a binary search across time-frames as opposed to a linear search used in traditional techniques.

To illustrate the advantage of this model, consider the problem of finding the number of time-frames necessary to set the most significant bit of an 8-bit counter to one, given an initial value of the counter as zero. Using conventional techniques, the behavior of the circuit must be modeled separately for each time-frame to be tested. Thus beginning with the first time-frame, the conventional techniques will test one hundred and twenty-eight models before finding a solution to the problem. In contrast, using binary time-frame expansion, logic analysis can prove in a single step and with a single model that for all values of t having an eight bit of zero, the problem is infeasible (that is, does not have a solution).

Using binary time-frame expanded models of a sequential circuit, systems analysis programs may perform simulation, validation, and verification of the sequential circuit. For example, state justification is a fundamental problem in test and validation of sequential circuits. In one version of a state justification problem, logic analysis must determine a sequence of input vectors that transition the state of a sequential circuit from an initial value to a desired state. Another type of state justification problem attempts to determine whether a particular state is reachable within some number of clock cycles or time-frames. Another type of analysis attempts to determine inputs that will result in a set of given outputs.

In many of these processes, the analysis determines whether the problem is solvable and, if so, the input vectors that result in a desired condition, such as an output or state. For example, given a particular output, analysis of the sequential circuit may determine that the output can be reached using particular inputs over a series of time-frames. Because the operation of sequential circuits is driven by states, time is a common theme among various types of circuit analysis of sequential circuits. The binary time-frame expanded models generated using the disclosed techniques enable binary searches across time. This can significantly increase the performance of and decrease the time required for systems analysis.

Figure 5:
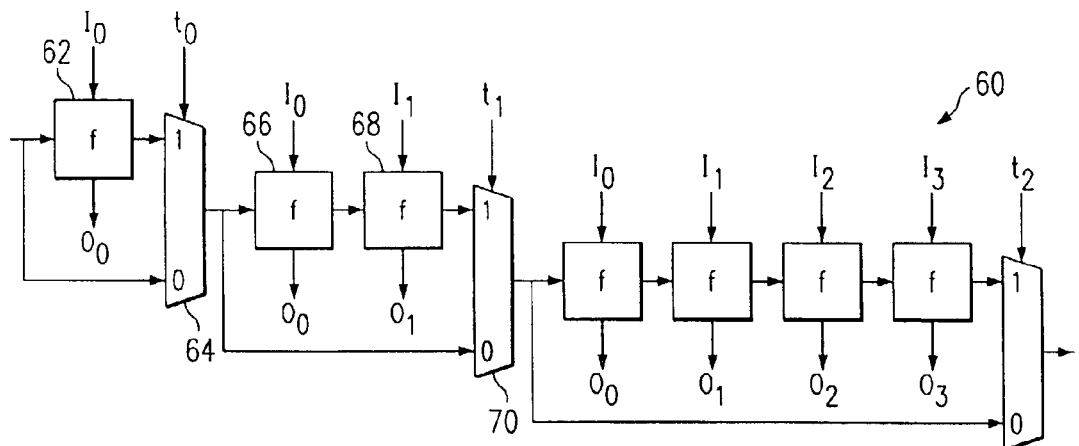
FIG. 5 is a block diagram illustrating a particular example of a sequential system that has been time-frame expanded to allow analysis of operation over time-frames zero to seven.

FIG. 5 is a block diagram illustrating a binary time-frame expanded model, indicated at 60, modeling the operation of a sequential circuit across eight time-frames. To model the first eight time-frames (0–7) requires at least a 3-bit binary value for t. Thus the circuit model includes three binary time-frame expanded clauses. Each of these three time-frame clauses is modeled according to Equation 4 as modeled in clause 44.

The first clause includes a single instance of the sequential circuit 62 and a multiplexer 64. Circuit 62 processes input and generates output and a resulting state based upon an initial state received by the first clause. Multiplexer 64 selects between the initial state and the resulting state based on the value for the binary digit of $t_0$. Thus multiplexer 64 selects, based upon the value for $t_0$, between the initial state received by the first clause and the state resulting from the operation of the single instance of the sequential circuit in the first clause. Multiplexer 64 provides the selected state as initial state information to the second time-frame clause.

The second clause of the circuit model includes a series of two copies of the sequential circuit, indicated at 66 and 68, and a multiplexer 70. Circuit 66 processes input for the second time-frame of operation and generates output based upon the state information received from multiplexer 64. Circuit 66 also generates state information and passes this state information to circuit 68. Circuit 68 processes input for the third time-frame of operation and generates output based upon the state information received from circuit 66. Circuit 68 also generates state information and passes this state information to multiplexer 70. Multiplexer 70 selects, based upon the value for $t_1$, between the initial state received by the second clause and the state resulting from the operation of the series of sequential circuits in the second clause. If $t_1$ is equal to zero, multiplexer selects the state information provided from multiplexer 64. If $t_1$ is equal to 1, multiplexer selects the state information from circuit 68. Therefore, depending on the value of $t_1$, the second time-frame clause will either contribute state information or not. Muliplexer 70 provides the selected state as initial state information to the third time-frame clause.

In the third time-frame clause, a series of four copies of the sequential circuit operate on inputs to provide outputs based upon state values passed between the circuits. Similar to the previous clauses, the value for $t_2$ controls a multiplexer to select between the state resulting from the series of sequential circuits and the initial state provided from time-frame clause two.

As shown by this illustration, the binary time-frame expanded model of the sequential circuit receives as variables both values for inputs in various time-frames and values for t. Using this model, systems analysis routines can perform various simulation, validation, and verification of the sequential circuit as it operates across time-frames. For example, systems analysis may perform state justification of the sequential system using the model. Using model 60, systems analysis routines can perform various simulations across the first seven time-frames of operation of the sequential circuit. Using similar models, system 10 can model sequential circuits over any number of time-frames.

Figure 6:
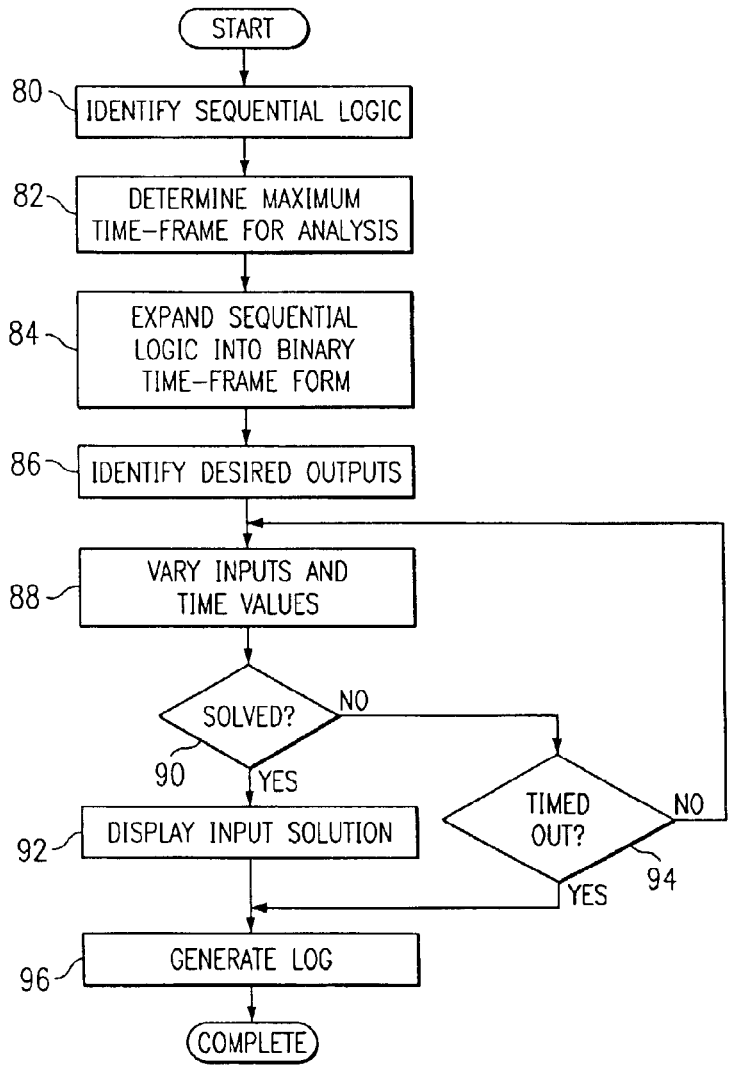
FIG. 6 is a flowchart illustrating a method for expanding sequential systems and analyzing the resulting binary time-frame expanded model.

FIG. 6 is a flowchart illustrating a method for modeling a sequential circuit and analyzing the sequential circuit using the resulting model. System 10 identifies a sequential system at step 80. For example, a user may input sequential logic using circuit design programs or identify a particular sequential circuit within sequential system designs 26. System 10 determines the maximum time-frame for analysis at step 82. For example, system 10 may determine a default value for the maximum number of time-frames over which to analyze a sequential circuit or may receive instructions from a user through input 14 identifying a maximum time-frame. System 10 expands the sequential system into binary time-frame form at step 84. For example, OAM module 24 may process the sequential system using expansion module 20 to generate a binary time-frame expanded model having the appropriate number of time-frame clauses to solve up to the maximum time-frame for analysis.

System 10 identifies desired outputs from the sequential circuit at step 86. For example, a user or other appropriate source may specify outputs or states to obtain using the sequential circuit. System 10 then uses the binary time-frame expanded model to identify appropriate inputs and time-frames for achieving these outputs and/or states. To determine the inputs, system 10 varies inputs and time values at step 88. For example, system 10 may analyze the model using systems analysis module 22 by varying inputs and time values in accordance with any appropriate analysis algorithm. System 10 determines whether the problem has been solved at step 90. For example, system 10 may determine whether any of the attempted inputs and time values have resulted in the desired outputs. If so, system 10 displays the input solution at step 92 and generates a log entry at step 96. For example, system 10 may generate an analysis report that specifies the particular inputs for obtaining the desired outputs. This can provide, for example, test vectors for use in testing of actual circuits manufactured according to the sequential system design.

The analysis of the sequential circuit continues until the problem is solved at step 90 or until the analysis times out at step 94. According to particular embodiments, configurations and/or user settings may specify a period of time over which systems analysis module 22 will attempt to solve a given problem. If systems analysis module 22 has not solved the problem in the given time period, it times out and generates a report in log 28 identifying the parameters of the problem, the performance of the analysis, and/or other appropriate information.

However, the preceding flowchart and accompanying description illustrate only an exemplary method of operation, and system 10 contemplates using any appropriate techniques for generating a binary time-frame expanded model of a sequential circuit and analyzing the sequential circuit using the generated model. Thus, many of the steps in this flowchart may take place simultaneously and/or in different orders than as shown. Moreover, system 10 may use methods with additional steps, fewer steps, and/or different steps, so long as the methods remain appropriate.

Although the present invention has been described in several embodiments, a myriad of changes and modifications may be suggested to one skilled in the art, and it is intended that the present invention encompass such changes and modifications as fall within the scope of the present appended claims.

What is claimed is:

1. A method for processing sequential systems comprising:
   determining a maximum time-frame for analysis of a sequential system, the maximum time-frame representable using an n-bit binary value;
   generating a binary time-frame expanded model of the sequential system, the binary time-frame expanded model having n cascaded binary time-frame clauses;
   analyzing the sequential system using the binary time-frame expanded model; and
   generating an analysis report.

2. The method of claim 1, wherein:
   each of the clauses has a relative position, p, counted from the first of the clauses, which hasp equal to zero; and
   each of the clauses comprises a series of $2^p$ copies of the sequential system.

3. The method of claim 2, wherein each of the clauses:
   receives an initial state and $2^p$ input sets; and
   generates a resulting state and $2^p$ output sets using the initial state and the input sets.

4. The method of claim 3, wherein, for each of the clauses:
   a first copy of the sequential system receives a first one of the input sets and the initial state and generates a first one of the output sets and a state; and
   each subsequent copy of the sequential system receives a subsequent one of the input sets and a state from a preceding one of the copies of the sequential system in the series and generates a subsequent one of the output sets and a state.

5. The method of claim 2, wherein each of the clauses receives an initial state and produces a resulting state, the resulting state a selection between the initial state and a state generated from the series of copies of the sequential system.

6. The method of claim 5, further comprising, for each clause, selecting between the initial state and the state generated from the series of copies of the sequential system based on a value for the $p^{th}$ digit in a binary representation of a time-frame under analysis.

7. The method of claim 6, further comprising, for each clause:
   selecting the initial state if the $p^{th}$ digit in the binary representation has a value of zero; and
   selecting the state generated from the series of copies of the sequential system if the $p^{th}$ digit in the binary representation has a value of one.

8. The method of claim 1, wherein analyzing the sequential system:
   specifying a desired condition for the sequential system; and
   analyzing the binary time-frame expanded model to identify input vectors that result in the desired condition.

9. The method of claim 8, wherein generating the analysis report comprises:
   determining whether the analysis has identified the input vectors for obtaining the desired condition;
   if the analysis has identified the input vectors, identifying the input vectors within the analysis report; and
   if the analysis has not identified the input vectors, indicating that the desired condition represent an infeasable problem in the analysis report.

10. The method of claim 1, wherein the sequential system comprises a semiconductor design having a plurality of logic elements and at least one memory element, the memory element maintaining state information used by at least one of the logic elements.

11. Software for processing sequential systems, the software embodied in a medium and operable when executed:
    to determine a maximum time-frame for analysis of a sequential system, the maximum time-frame representable using an n-bit binary value;
    to generate a binary time-frame expanded model of the sequential system, the binary time-frame expanded model having n cascaded binary time-frame clauses;
    to analyze the sequential system using the binary time-frame expanded model; and
    to generate an analysis report.

12. The software of claim 11, wherein:
    each of the clauses has a relative position, p, counted from the first of the clauses, which hasp equal to zero; and
    each of the clauses comprises a series of $2^p$ copies of the sequential system.

13. The software of claim 12, wherein the software is further operable, for each of the clauses:
    to receive an initial state and $2^p$ input sets; and
    to generate a resulting state and $2^p$ output sets using the initial state and the input sets.

14. The software of claim 13, wherein, for each of the clauses:
    a first copy of the sequential system receives a first one of the input sets and the initial state and generates a first one of the output sets and a state; and
    each subsequent copy of the sequential system receives a subsequent one of the input sets and a state from a preceding one of the copies of the sequential system in the series and generates a subsequent one of the output sets and a state.

15. The software of claim 12, wherein each of the clauses receives an initial state and produces a resulting state, the resulting state a selection between the initial state and a state generated from the series of copies of the sequential system.

16. The software of claim 15, further comprising, for each clause, selecting between the initial state and the state generated from the series of copies of the sequential system based on a value for the $p^{th}$ digit in a binary representation of a time-frame under analysis.

17. The software of claim 16, further comprising, for each clause:
    selecting the initial state if the $p^{th}$ digit in the binary representation has a value of zero; and
    selecting the state generated from the series of copies of the sequential system if the $p^{th}$ digit in the binary representation has a value of one.

18. The software of claim 11, wherein analyzing comprises:
    specifying a desired condition for the sequential system; and
    analyzing the binary time-frame expanded model to identify input vectors that result in the desired condition.

19. The software of claim 18, wherein generating the analysis report comprises:
    determining whether the analysis has identified the input vectors for obtaining the desired condition;
    if the analysis has identified the input vectors, identifying the input vectors within the analysis report; and if the analysis has not identified the input vectors, indicating that the desired condition represent an infeasable problem in the analysis report.

20. A binary time-frame expanded model of a sequential system comprising:

a plurality of binary time-frame clauses coupled in series, wherein each of the clauses has a relative position in the series, p, counted from the first of the clauses, which has p equal to zero, and wherein each of the clauses comprises a series of $2^p$ copies of the sequential system and a multiplexer;

wherein within each of the clauses, each of the copies receives an input set and input state information and generates an output set and output state information, a first copy in the series receives initial state information for the clause as the input state information for the first copy, other copies in the series receive the output state information from a preceding one of the copies in the series as the input state information for the other copies, and a last copy in the series provides the output state information from the last copy to the multiplexer; and wherein each of the clauses receives the initial state information for the clause, provides the initial state information for the clause to the multiplexer, controls the multiplexer based on a value for the $p^{th}$ digit in a binary representation of a time-frame under analysis to select between the output state information from the last copy and the initial state information for the clause, and provides selected state information from the multiplexer to a next one of the clauses.

* * * * *

UNITED STATES PATENT AND TRADEMARK OFFICE
CERTIFICATE OF CORRECTION

PATENT NO. : 6,871,310 B2  
APPLICATION NO. : 10/162018  
DATED : March 22, 2005  
INVENTOR(S) : Farzan Fallah Page 1 of 1

It is certified that error appears in the above-identified patent and that said Letters Patent is hereby corrected as shown below:

Column 1, Line 7, after "particularly," insert -- to binary --.
Column 7, Line 20, Claim 2, after "which", delete "hasp" and insert -- has p --.
Column 8, Line 20, Claim 12, after "which", delete "hasp" and insert -- has p --.

Signed and Sealed this

Eleventh Day of July, 2006

JON W. DUDAS  
*Director of the United States Patent and Trademark Office*